(12) United States Patent
Atwater et al.

(10) Patent No.: US 9,627,434 B2
(45) Date of Patent: Apr. 18, 2017

(54) SYSTEM AND METHOD FOR COLOR IMAGING WITH INTEGRATED PLASMONIC COLOR FILTERS

(71) Applicant: California Institute of Technology, Pasadena, CA (US)

(72) Inventors: Harry A. Atwater, South Pasadena, CA (US); Stanley Burgos, San Jose, CA (US); Sozo Yokogawa, Tokyo (JP)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 245 days.

(21) Appl. No.: 14/148,672

(22) Filed: Jan. 6, 2014

(65) Prior Publication Data

US 2014/0191113 A1    Jul. 10, 2014

Related U.S. Application Data

(60) Provisional application No. 61/749,123, filed on Jan. 4, 2013.

(51) Int. Cl.
*H01J 40/14* (2006.01)
*H01L 27/146* (2006.01)
*H01L 31/0232* (2014.01)

(52) U.S. Cl.
CPC .. *H01L 27/14685* (2013.01); *H01L 27/14621* (2013.01); *H01L 27/14629* (2013.01); *H01L 31/0232* (2013.01); *H01L 31/02327* (2013.01)

(58) Field of Classification Search
CPC ......... H01L 27/14621; H01L 27/14629; H01L 31/0232; H01L 31/02327; H01L 27/14685
USPC .............................................. 250/226, 208.1
See application file for complete search history.

(56) References Cited

U.S. PATENT DOCUMENTS

| | | | |
|---|---|---|---|
| 5,973,316 A | 10/1999 | Ebbesen et al. | |
| 6,040,936 A | 3/2000 | Kim et al. | |
| 6,236,033 B1 | 5/2001 | Ebbesen et al. | |
| 6,285,020 B1 | 9/2001 | Kim et al. | |
| 8,094,394 B2 * | 1/2012 | Yamada | G02B 5/008 359/241 |
| 8,724,006 B2 * | 5/2014 | Brady | H04N 3/1587 348/208.1 |

(Continued)

FOREIGN PATENT DOCUMENTS

WO    WO 2012054351 A2 *   4/2012    ............. B82Y 15/00

OTHER PUBLICATIONS

Yokogawa, et al., Plasmonic Color Filters for CMOS Image Sensor Applications, NanoLetters, ACS Publications, Copyright XXXX American Chemical Society, Received Jun. 5, 2012, 6 pgs.

(Continued)

*Primary Examiner* — Thanh Luu
*Assistant Examiner* — Kevin Wyatt
(74) *Attorney, Agent, or Firm* — Lewis Roca Rothgerber Christie LLP

(57) ABSTRACT

A device for color imaging including an optical sensor having light sensitive pixels with a metal film disposed over the light sensitive pixels. The metal film has a group of nano-holes arranged over the pixels according to a periodic lattice formation and is configured to pass light of a preselected first range of wavelengths. The group of nano-holes arranged over an adjoining group of pixels is configured to pass light having ranges of wavelengths different from the first range of wavelengths.

14 Claims, 7 Drawing Sheets

(56) References Cited

U.S. PATENT DOCUMENTS

| | | | | |
|---|---|---|---|---|
| 2008/0217542 | A1* | 9/2008 | Verma | H01L 31/022408 250/370.01 |
| 2009/0146081 | A1* | 6/2009 | Stark | B82Y 20/00 250/492.2 |
| 2010/0271174 | A1* | 10/2010 | Kaminska | B42D 25/29 340/5.86 |
| 2011/0315988 | A1* | 12/2011 | Yu | H01L 27/14 257/52 |
| 2012/0086021 | A1* | 4/2012 | Wang | G01N 21/658 257/84 |
| 2013/0153767 | A1* | 6/2013 | Savoy | G01J 1/0429 250/338.1 |

OTHER PUBLICATIONS

Burgos, et al., Color Imaging via Nearest Neighbor Hole Coupling in Plasmonic Color Filters Integrated onto a Complementary Metal-Oxide Semiconductor Image Sensor, ACS Nano Article, www.acsnano.org, vol. 7, No. 11, 10038-10047, 2013, 10 pgs.

Barnes, W.L., et al., Surface Plasmon Polaritons and Their Role in the Enhanced Transmission of Light through Periodic Arrays of Subwavelength Holes in a Metal Film, *Physical Review Letters*, vol. 92, No. 10, Mar. 12, 2004, pp. 107401.1-107401.4.

Barnes, W.L., et al., Surface Plasmon Subwavelength Optics, *Nature*, vol. 424, Aug. 14, 2003, pp. 824-830.

Bravo-Abad, J., et al., How light emerges from an illuminated array of subwavelength holes, *Nature Physics*, vol. 2, Feb. 2006, pp. 120-123.

Burgos, S., et al., A single-layer wide-angle negative-index metamaterial at visible frequencies, *Nature Materials*, vol. 9, May 2010, pp. 407-412.

Catrysse, P., et al., Integrated color pixels in 0.18-µm complementary metal oxide semiconductor technology, *J. Opt. Soc. Am. A*, vol. 20, No. 12, Dec. 2003, pp. 2293-2306.

Chen, Q., et al., A CMOS Image Sensor Integrated with Plasmonic Colour Filters, *Plasmonics*, vol. 7, published online Mar. 27, 2012, pp. 695-699.

Chen, Q., et al., CMOS Photodetectors Integrated With Plasmonic Color Filters, *IEEE Photonics Technology Letters*, vol. 24, No. 3, Feb. 1, 2012, pp. 197-199.

Chen, Q., et al., High transmission and low color cross-talk plasmonic color filters using triangular-lattice hole arrays in aluminum films, *Optics Express*, vol. 18, No. 13, Jun. 21, 2010, pp. 14056-14062.

Ebbesen, T.W., et al., Extraordinary optical transmission through sub-wavelength hole arrays, *Nature*, vol. 391, Feb. 12, 1998, pp. 667-669.

Ghaemi, H.F., et al., Surface plasmons enhance optical transmission through subwavelength holes, *Physical Review B*, vol. 58, No. 11, Sep. 15, 1998, PRB 58, pp. 6779-6782.

Inaba, Y., et al., Degradation-Free MOS Image Sensor With Photonic Crystal Color Filter, *IEEE Electron Device Letters*, vol. 27, No. 6, Jun. 2006, pp. 457-459.

Inoue, D., et al., Polarization independent visible color filter comprising an aluminum film with surface-plasmon enhanced transmission through a subwavelength array of holes, *Applied Physics Letters*, 98, 093113 (2011), pp. 093113.1-093113.3.

Laux, E., et al., Plasmonic photon sorters for spectral and polarimetric imaging, *Nature Photonics*, vol. 2, Mar. 2008, pp. 161-164.

Lee, H.-S., et al., Color filter based on a subwavelength patterned metal grating, *Optics Express*, vol. 15, No. 23, Nov. 12, 2007, pp. 15457-15463.

Lezec, H., et al., Diffracted evanescent wave model for enhanced and suppressed optical transmission through subwavelength hole arrays, *Optics Express*, vol. 12., No. 16, Aug. 9, 2004, pp. 3629-3651.

Marani, R., et al., Gain-assisted extraordinary optical transmission through periodic arrays of subwavelength apertures, *New Journal of Physics*, 14 (2012) 013020, published Jan. 13, 2012, 16 pgs.

Martín-Moreno, L., et al., Theory of Extraordinary Optical Transmission through Subwavelength Hole Arrays, *Physical Review Letters*, vol. 86, No. 6, Feb. 5, 2001, pp. 1114-1117.

Murray, W.A., et al., Transition from localized surface plasmon resonance to extended surface plasmon-polariton as metallic nanoparticles merge to form a periodic hole array, *Physical Review B*, 69, 165407 (2004), pp. 165407.1-165407.7.

Nakamura, J., et al., Image Sensors and Signal Processing for Digital Still Cameras, Copyright 2006, CRC Press—Taylor & Francis Group, LLC, 322 pgs.

Pacifici, D., et al., Universal optical transmission features in periodic and quasiperiodic hole arrays, *Optics Express*, vol. 16, No. 12, Jun. 9, 2008, pp. 9222-9238.

Popov, E., et al., Theory of light transmission through subwavelength periodic hole arrays, *Physical Review B*, vol. 62, No. 23, Dec. 15, 2000, PRB 62, pp. 16 100-16 108.

Salvi, J., et al., Annular aperture arrays: study in the visible region of the electromagnetic spectrum, *Optics Letters*, vol. 30, No. 13, Jul. 1, 2005, pp. 1611-1613.

Sharma, G., et al., The CIEDE2000 Color-Difference Formula: Implementation Notes, Supplementary Test Data, and Mathematical Observations, *COLOR research and application, 2004 Wiley Periodicals*, vol. 30, No. 1, Feb. 2005, pp. 21-30.

Si, G., et al., Annular aperture array based color filter, *Applied Physics Letters*, 99 033105 (2011), published online Jul. 20, 2011, pp. 033105.1-033105.3.

Yokogawa, S., et al., Plasmonic Color Filters for CMOS Image Sensor Applications, *Nano Letters, ACS Publications*, published Jul. 16, 2012, pp. 4349-4354.

\* cited by examiner

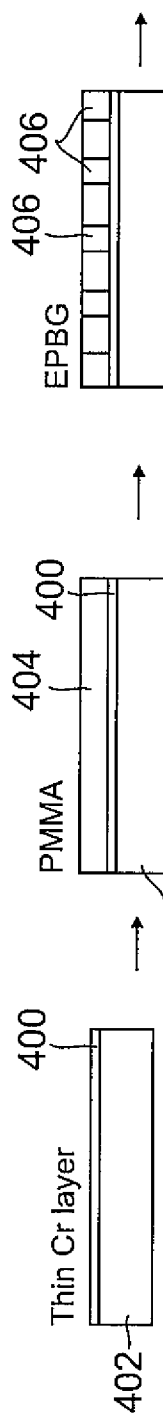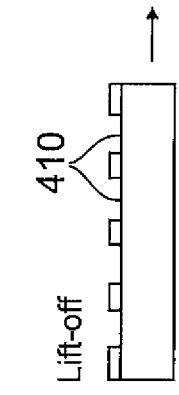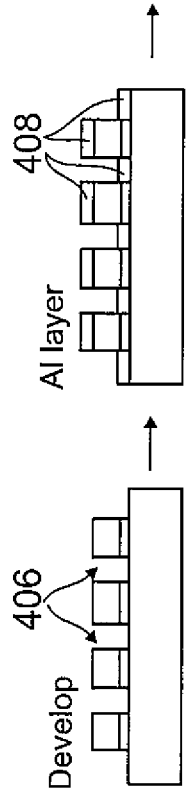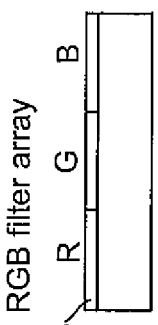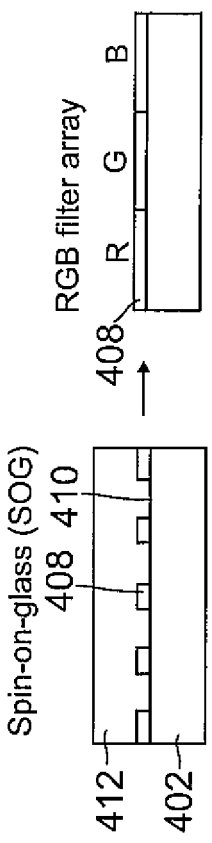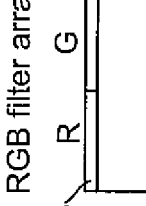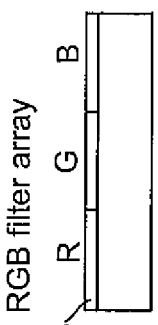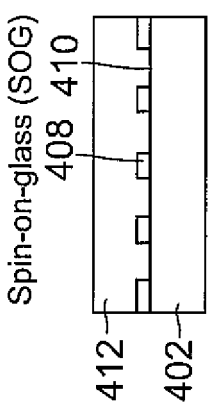

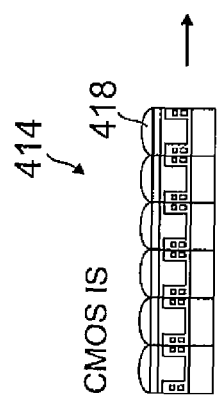
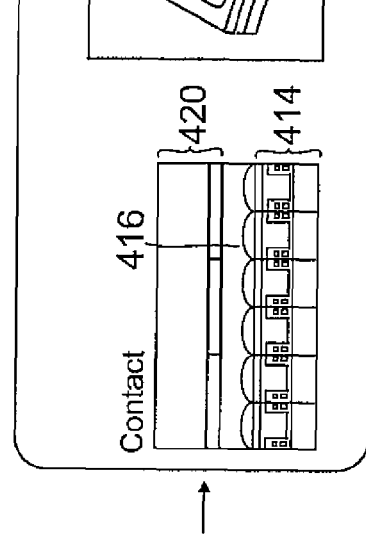
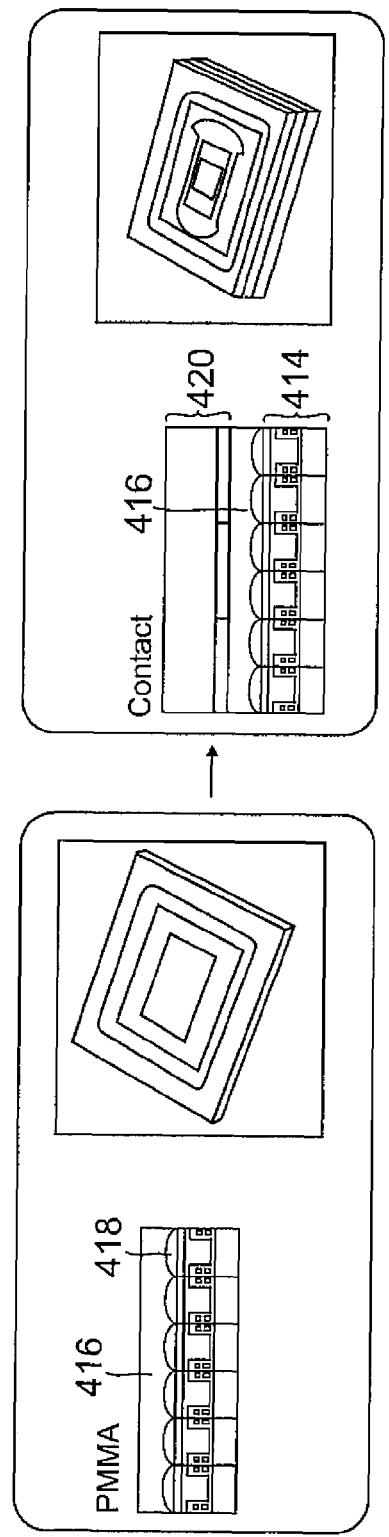
FIG. 4I
FIG. 4K
FIG. 4J

SYSTEM AND METHOD FOR COLOR IMAGING WITH INTEGRATED PLASMONIC COLOR FILTERS

CROSS-REFERENCE TO RELATED APPLICATION(S)

The present application claims priority to U.S. Provisional Patent Application No. 61/749,123 filed on Jan. 4, 2013, which is incorporated herein by reference in its entirety.

STATEMENT REGARDING FEDERALLY SPONSORED RESEARCH OR DEVELOPMENT

This invention was made with government support under FA9550-10-1-0264 and FA9550-09-1-0673 awarded by the Air Force. The government has certain rights in the invention.

FIELD

The present disclosure relates to plasmonic color filtering. More particularly, it relates to a system and method for color imaging with integrated plasmonic color filters.

BACKGROUND

In contemporary Si-based image sensor technologies such as charge-couple devices (CCDs) and complementary metal-oxide semiconductor (CMOS) image sensors, color sensitivity is added to photo detective pixels by equipping them with on-chip color filters, comprised of organic dye-based absorption filters. However, organic dye filters are not durable at high temperatures or under long exposure to ultraviolet (UV) radiation, and can be difficult to fabricate much thinner than a few hundred nanometers due to low absorption coefficient of the dye material. Furthermore, on-chip color filter implementation using organic dye filters rely on carefully aligned lithography steps for each type of color filter over the entire photodiode array, thus making such fabrication costly and highly impractical for multi-color and hyperspectral imaging devices having more than three primary or complementary colors.

SUMMARY

Embodiments of the invention are directed to a device for filtering selected colors of light. According to the embodiments, a plurality of holes can be formed in a thin metallic layer to filter the selected colors of light due to interference of surface plasmons between the plurality of holes. Thus, the color filter formed by plasmonic hole arrays can be combined together with individual pixels and sub-pixels or an imaging sensor to provide color imaging characteristics.

According to an aspect of the embodiments of the invention, a color imaging device is described, including: an optical sensor having a plurality of pixels, each pixel of the plurality of pixels including a plurality of sub-pixels, wherein each sub-pixel of the plurality of sub-pixels are adapted to sense light; and a metal film on the optical sensor. The metal film includes a group of nano-holes arranged over at least one sub-pixel according to a periodic lattice formation and is configured to pass light having, a preselected first range of wavelengths, wherein a group of nano-holes arranged over an adjoining sub-pixel is configured to pass light having ranges of wavelengths different from the first range of wavelengths.

According to another aspect, a diameter of each nano-hole of one of the groups of nano-holes is selected to pass light having a preselected range of wavelengths.

According to another aspect, spacing between adjoining nano-holes of the group of nano-holes is selected to pass light having a preselected range of wavelengths.

According to another aspect, the optical sensor is a CMOS image sensor or a CCD image sensor.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings in which like reference symbols indicate like components.

FIGS. 4A-4K is a series of schematic diagrams illustrating a method of fabricating a thin metallic film layer having a plasmonic hole array, and integrating the metallic film with a CMOS image sensor according to an embodiment of the invention.

DETAILED DESCRIPTION

Figure 1:
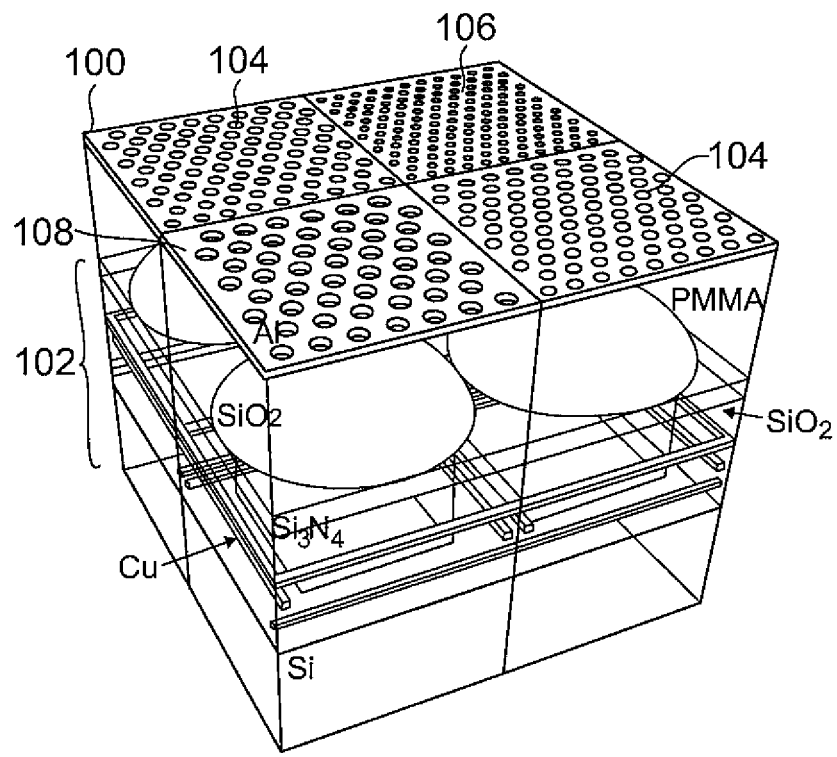
FIG. 1 is a perspective view of a plasmonic hole array integrated with a CMOS image sensor according to an embodiment of the present invention.

The present invention will now be described more fully with reference to the accompanying drawings, in which example embodiments thereof are shown. The invention may, however, be embodied in many different forms and should not be construed as being limited to the embodiments set forth herein. Rather, these embodiments are provided so that this disclosure is thorough and complete, and will fully convey the concept of the present invention to those skilled in the art.

While the described embodiments of the invention may be modified in various ways, the described embodiments are presented as examples in the drawings and in the detailed description below. The intention, however, is not to limit the invention to the particular embodiments described. To the contrary, the invention is intended to cover all modifications, equivalents, and alternatives falling within the scope of the invention as defined by the appended claims. Moreover, detailed descriptions related to well-known functions or configurations have been omitted in order not to unnecessarily obscure the subject matter of the present invention.

It will be understood that although the terms "first," "second," etc. may be used herein to describe various components, these components should not be limited by these terms. These descriptors are only used to distinguish one component from another. The terminology in this application is used to more clearly describe the presented embodiments and is not intended to limit the scope of the present invention.

As used herein, the singular forms "a," "an," and "the" are intended to include the plural forms as well, unless the context clearly indicates otherwise. It will be further understood that the terms "comprises" and/or "comprising," as used herein, specify the presence of the stated features or components, but do not preclude the presence or addition of one or more other features or components. "/", as used in herein may be interpreted as "and," or may be interpreted as "or" depending on the situation.

The sizes of the layers and regions in the drawings may be exaggerated for convenience of explanation. Like reference numerals refer to like elements throughout. It will be understood that when a layer, region, or component is referred to as being "on," "formed on," "over," or "formed over," another layer, region, or component, it can be directly or indirectly on or formed on the other layer, region, or component. That is, for example, intervening layers, regions, or components may be present.

Plasmonic hole arrays formed in thin metal films (e.g., 150 nm thick) can behave as optical band-pass filters due to interference of surface plasmons (SPs) between adjacent holes. Thus, a plasmonic hole array can be utilized as a plasmonic color filter to allow a certain wavelength (or a range or spectrum of wavelengths) of light to pass through the plasmonic hole array, and prevent other wavelengths of light from passing. For example, the plasmonic hole array can be configured by selecting the size of the holes (i.e., diameter of the holes), the period or periodicity of the lattice (i.e., distance between the holes, lattice constant), and even the shape(s) of the holes, such that a predetermined color of light (e.g., red) will pass through the plasmonic hole array while preventing other colors of light (e.g., blue, green, etc.) from passing through the plasmonic hole array. According to an embodiment of the invention, the thickness of the metal film is in the range of 50-200 nm. However, the metal film may be as thin as 30 nm, or as thick as 1000 nm (i.e., 30-1000 nm). In the context of the present disclosure, the term "plasmonic hole array" is used interchangeably with the terms "plasmonic color filter" and "color filter," and the term "color" means a wavelength or a distribution of wavelengths of electromagnetic radiation incident on a plasmonic hole array.

According to an embodiment of the invention, a plasmonic hole array can be disposed over a black and white image sensor (i.e., an image sensor that is not capable by itself of recognizing color), and behave as a color filter for the image sensor. As such, the integrated black and white image sensor in combination with the color filter is able to recognize a color image. By way of example and not of limitation, the image sensor can be a CMOS image sensor 102 as shown in FIG. 1, with the plasmonic hole array 100 positioned over the CMOS image sensor 102 to allow a selected color of light to pass through the plasmonic hole array 100 such that the selected color of light is detected by the CMOS sensor. More specifically, according to the exemplary embodiment of FIG. 1, the plasmonic hole array 100 is divided into four substantially square-shaped arrays 104, 106, 108, such that the hole arrangement of array 104 is configured to pass green light, the hole arrangement of array 106 is configured to pass blue light, and the hole arrangement of array 108 is configured to pass red light.

In the illustrated embodiment, the four arrays are aligned and positioned over a single pixel of the CMOS image sensor, with each array of the four arrays positioned precisely over one sub-pixel of the CMOS image sensor. Thus, one pixel of the CMOS image sensor is configured to sense each of three colors, red, green and blue. A person having ordinary skill in the art will recognize that red, green and blue light can be arranged, for example, in a Bayer filter mosaic arrangement. However, the number and/or configuration of sub-pixels in a pixel, or the colors of light, are not necessarily limited to those mentioned herein.

In contrast to on-chip organic color filters, the plasmonic color filters are highly tunable across the visible (and non-visible) electromagnetic spectrum by varying characteristics (size, spacing, periodicity, shape, etc.) of the holes of the array. Plasmonic color filters may also utilize a single perforated metallic layer to fabricate filters for many colors of light. That is, a filter for any desired color can be fabricated on a single metallic film at once. Furthermore, spatial color-crosstalk is reduced among the adjacent hole arrays.

In accordance with the invention, it has been discovered that the principal filtering function of a plasmonic hole array results from "near-field effects," i.e., from plasmonic interactions between each hole and its nearest and/or next-nearest neighbor holes (e.g., second-nearest neighbor holes). Thus, it has been found that filtering efficiency does not require an infinite or near-infinite array of holes (i.e., an array relying on "far-field effects"), but rather, a relatively compact array may suffice. In specific embodiments, a filtering array may be as small as a 2×2 lattice unit cell (i.e., 4 holes), a 3×3 lattice unit cell (i.e., 9 holes), or a 4×4 lattice unit cell (i.e., 16 holes). Furthermore, it has been determined that arrays of these sizes can be placed directly adjacent arrays having different wavelength characteristics (i.e., in front of different pixels or sub-pixels) in a sensor array without exhibiting significant "crosstalk" between pixels or sub-pixels.

Figure 2:
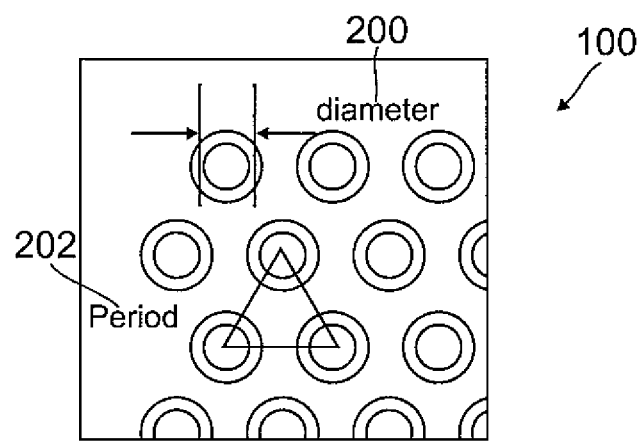
FIG. 2 is a schematic diagram depicting a film having an array of holes arranged in a triangular lattice.

FIG. 2 shows an array of holes arranged in a triangular lattice. Each of the holes is substantially circular, and has a diameter 200 and a period 202 that varies in size and distance depending on the color that the plasmonic hole array is selected to filter. That is, an optimal hole size and period is selected based on the desired wavelength of light that the plasmonic hole array is designed to filter/pass. According to an embodiment of the present invention, the holes for filtering the green light (~550 nm) are about 180 nm in diameter with a period of about 340 nm; the holes for filtering the red light (~650 nm) are about 240 nm in diameter with a period of about 420 nm; and the holes for filtering the blue light (~450 nm) are about 140 nm in diameter with a period of about 260 nm. Thus, a substantially square shaped array of holes in a triangular pattern can be made on the metal film layer, such as aluminum or any other suitable conductor or insulator material. With regard to conductors, a variety of metals, such as, gold, silver, copper, platinum, titanium nitride, indium tin oxide, or doped zinc oxides, for example, may be used to create the plasmonic color filter. In the context of the present disclosure, the term "nano-holes" is used interchangeably with the term "holes." However, the diameters, periodicity, and shapes of the holes are not limited to those specifically described here. For example, the sizes of the holes can be, but not necessarily limited to, a diameter of approximately 50-1000 nm. In some embodiments, the size of the holes can be unequal. In such a case, the transmittance of light distribution passing through the array of holes is reduced, but the bandwidth profile becomes sharper. In some embodiments, the periodicity of the holes can also be unequal.

Figure 3B:
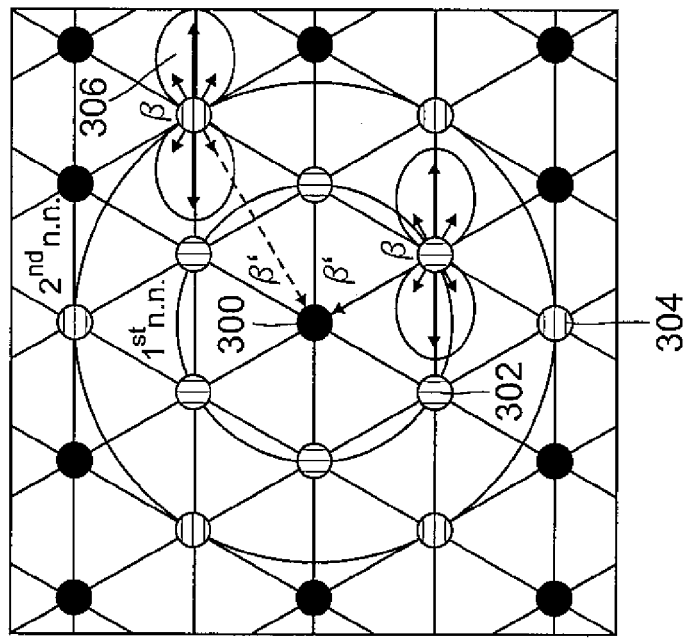
FIG. 3B depicts transmission efficiency curves based on the schematic of FIG. 3A.
Figure 3A:
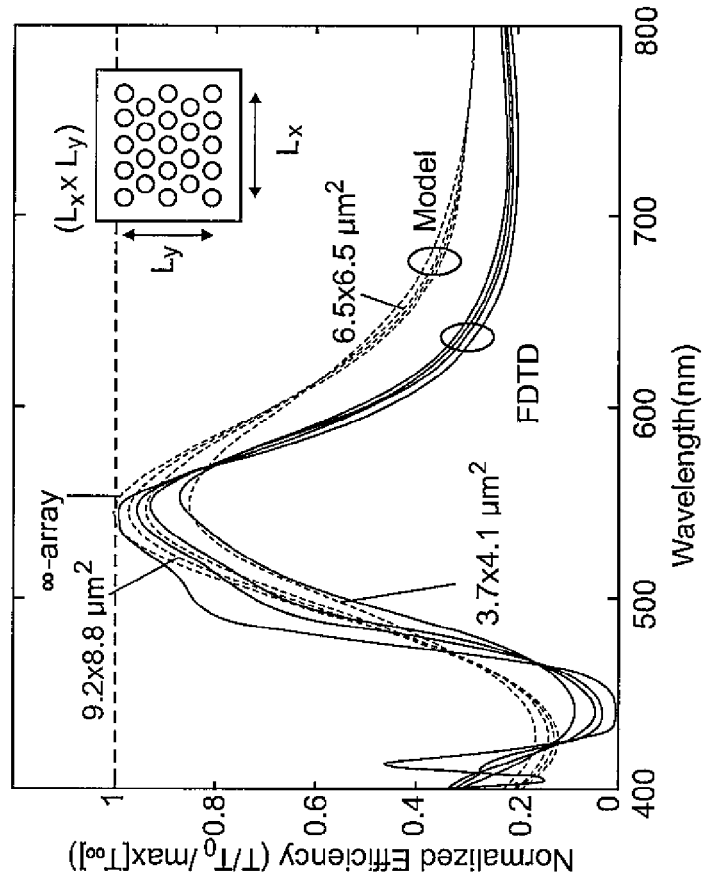
FIG. 3A is a schematic diagram of a film having a triangular lattice hole array showing a scattering-absorption model of surface plasmons.

FIG. 3A shows a schematic of a square-shaped triangular lattice hole array, showing a scattering-absorption model of the surface plasmons. According to an embodiment of the invention, transmission spectra of a relatively large array of holes (e.g., an infinite size hole array) can be produced by accounting for hole interactions of only nearest neighbor and second nearest-neighbors within the array. The scattering-absorption efficiencies can be determined by fitting finite-difference time-domain (FDTD) transmission data to a scattering-absorption model consisting of a truncated Fabry-Perot resonance between hole pairs. Although subwavelength holes are known to scatter both in circularly expanding surface plasmons 306 and in linear surface plasmons, the scattering contribution of circular surface plasmons 306 dominate the transmission spectra of the array. Thus, hole positions that are within "line-of-sight" of the hole of interest can be observed to approximate the transmission of the array to analyze the second nearest-neighbor interactions, since scattering from holes at larger distances can be thought of as being screened by the first and second nearest neighbors.

For example, considering the hole of interest 300 shown at the center of the array of FIG. 3A, the holes 302 are the first nearest-neighbor holes relative to the hole of interest 300, and the holes 304 are the second nearest-neighbor holes relative to the hole of interest 300. The transmission spectra has a maximum amplitude at a surface plasmon wavelength that is approximately twice the diameter of the hole. That is, $d\sim\lambda_{SP}/2$. According to an embodiment of the present invention, the array of holes can comprise as few as just four holes. Accordingly, there is negligible spatial crosstalk between the different color hole arrays (e.g., adjacent hole arrays), and therefore there is negligible scattering of light into adjacent sub-pixels from the hole array after the light is coupled through the plasmonic filter.

FIG. 3B shows transmission efficiency curves based on the schematic of FIG. 3A, where the transmission spectra obtained by FDTD (solid curves) for a large-size hole array are in agreement with the second nearest-neighbor scattering model (dashed curves).

Although the square-shaped array can be of various sizes, the array described in the present disclosure is about ~3×3 $\mu m^2$ to correspond to the size of the pixels generally found on a CMOS image sensor. By systematically increasing the size of the hole array by adding rows and columns to the ~3×3 $\mu m^2$ array, and normalizing to an infinite array for reference, an asymptotic behavior of the spectra can be analyzed. Based on this analysis, the peak transmission value for a ~4×4 $\mu m^2$ array (consisting of 10×12=120 holes) is ~80% of the peak efficiency with respect to an infinite array for size. The peak transmission value for a ~6×6 $\mu m^2$ array increases to ~90% of the peak efficiency with respect to an infinite array, with only a minimal increase for array sizes beyond ~10×10 $\mu m^2$. Thus, the ~6×6 $\mu m^2$ hole array shows near-infinite array transmission properties, with any additional increase in size providing marginal increases in transmission.

FIGS. 4A-4K show a method of making a color filter by fabricating a plasmonic hole array with a metallic film layer, and integrating the plasmonic hole array with the CMOS image sensor. As discussed above, for purposes of this description, a Bayer filter mosaic layout is utilized, which consists of a pixel having a 2×2 color sub-pixel with two green filters, a blue filter and red filter. In other embodiments, the layout of filters may be in any other suitable mosaic pattern depending on physical parameters and constraints of use.

According to an embodiment of the invention, the fabrication process starts with a thin chromium layer 400 over a quartz substrate 402 as shown in FIG. 4A. A layer of polymethyl methacrylate (PMMA) 404 is coated on the chromium layer 400 and a series of electron beam lithography steps are performed to develop a pattern 406 that represents the holes, as shown in FIGS. 4B-4D. Next, a layer of aluminum 408 is coated and the remaining chemicals on the quartz substrate are removed (FIG. 4D), thus obtaining a thin metallic film layer 408 with a plurality of holes 410 arranged in an array. Finally, a layer of glass 412 is spin coated on the metal film as shown in FIG. 4G. FIG. 4H shows conceptually, the resulting plasmonic color filter having a red filter region R, a green filter region G, and a blue filter region B.

According to an embodiment, a 180×160 pixel color filter (e.g., Bayer mosaic) is created using this method, onto a quartz substrate having a total of 360×320 sub-pixels (e.g., dimensions 2016×1792 $\mu m^2$). Each of the pixels is separated by 11.2 $\mu m$ wide grid lines separating the color filter into 40×40 filter blocks (corresponding to 224×224 $\mu m^2$), which were created during the fabrication process to both prevent overexposure of the peripheral region of each block during electron beam lithography and to serve as guide lines for alignment with the CMOS image sensor pixel array.

FIGS. 4I-4K show a method of integrating of the plasmonic hole array color filter with a front-side-illumination black and white CMOS image sensor 414 composed of 1920×1200 2.8×2.8 $\mu m^2$ size pixels, corresponding to a 5376×3360 $\mu m^2$ effective pixel area. In some embodiments, the CMOS image sensor 414 is coated with a layer such as, for example PMMA 416 to create a flat surface over the microlens 418 of the CMOS image sensor as shown in FIG. 4J. The plasmonic hole array color filter 420 can be disposed on the PMMA 416 to directly couple with the CMOS image sensor 414. In some embodiments, a microlens 418 of the CMOS image sensor 414 is first, flattened/smoothed by, for example, shaving or grinding the microlens 418 portion. The plasmonic hole array can be placed directly on the flattened microlens 418 of the CMOS image sensor 414, or the PMMA 416 can be layered between the CMOS image sensor 414 and the plasmonic hole array 420. The specific type and size of CMOS image sensor described above is an example for purposes of this disclosure, and instead any other suitable image sensor known by those skilled in the art can be utilized.

In some embodiments, the plasmonic color filter with the integrated CMOS image sensor is combined together with an optical lens, such as, for example, a C-mount camera lens to focus light (containing an image) onto the plasmonic color filter.

Figure 5C:
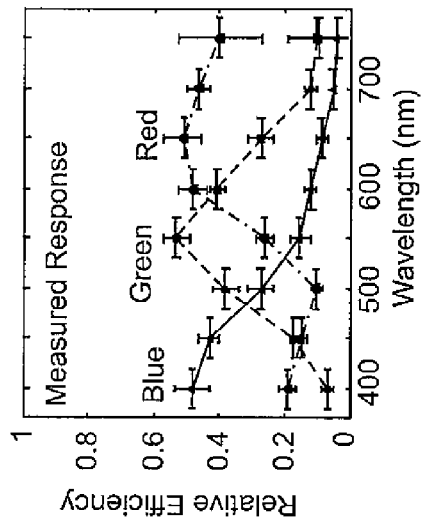
FIGS. 5A-5D show various plots of absolute and relative transmission efficiencies of plasmonic hole arrays at various wavelengths.
Figure 5D:
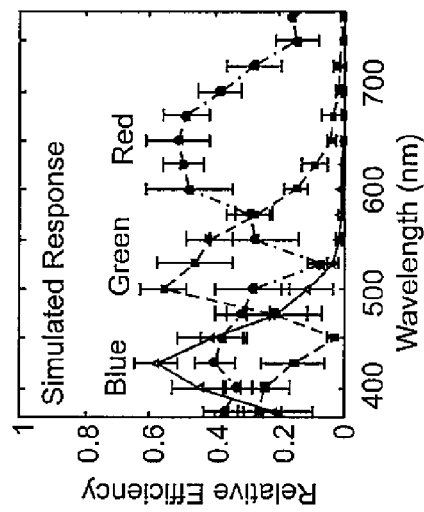
Figure 5A:
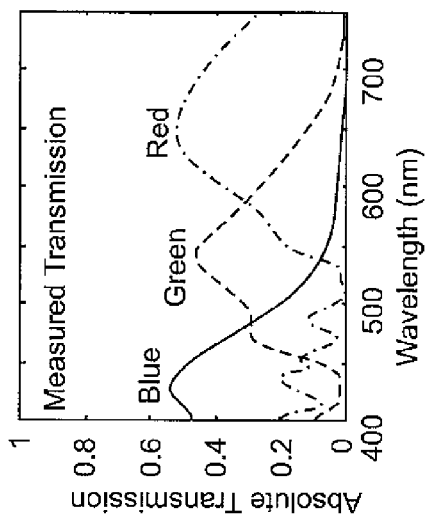
Figure 5B:
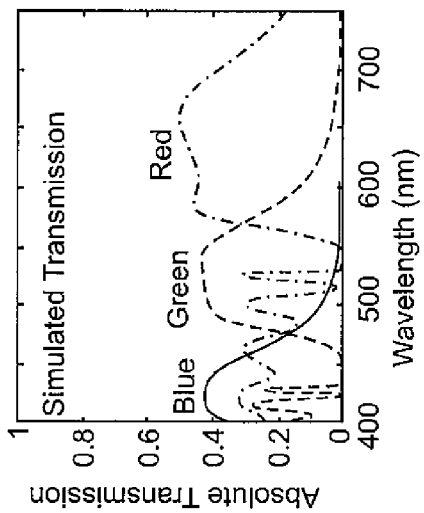

FIG. 5B shows an example of computed spectral transmission data of an unmounted plasmonic color filter embedded in the quartz substrate, and illuminated from a normal angle of incidence. FIG. 5A shows an example of measured spectral transmission data of a plasmonic color filter, where each of the three RGB filters have peak efficiencies in the 50-60% range with full-width at half maximum (FWHM) in the 150-200 nm range, which is consistent with transmission data extracted from full field electromagnetic simulations using FDTD calculations for the unmounted plasmonic color filters of FIG. 5B.

FIG. 5C shows an example of measured spectral transmission data of a plasmonic color filter that is integrated with the CMOS image sensor. The measured spectral image for red, green and blue color bands with a FWHM of 40 nm and center wavelengths ranging from 400-750 nm in 50 nm steps is shown plotted in FIG. 5C. The focal length of the C-mount lens utilized to obtain the spectral transmission data is 12.5 mm and an f-number of 5.6. A comparison of the transmission efficiencies between the unmounted (FIG. 5A) and CMOS integrated (FIG. 5C) plasmonic color filters show a quantitative measurement of how well the plasmonic color filters are integrated onto the CMOS image sensor. In comparing these two data sets, the integrated peak transmission efficiencies are in the 50% range, which is slightly lower than those of the unmounted color filters (FIG. 5A). Thus, integrating the color filter in direct contact with the CMOS image sensor negligibly degrades the efficiency.

FIG. 5D shows the relative efficiency of the CMOS image sensor integrated with the plasmonic hole array color filters. The horizontal error bars correspond to the spectral width of the band-pass filter used for the measurements and the vertical error bars correspond to averaged data.

Figure 6C:
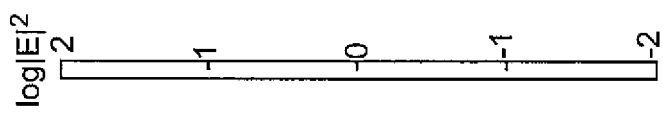
FIGS. 6A-6C show exemplary steady state field intensity distributions of three integrated color filters for each of the three colors, read, green and blue.
Figure 6C:
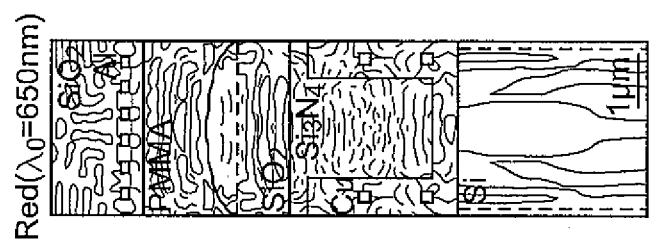
Figure 6B:
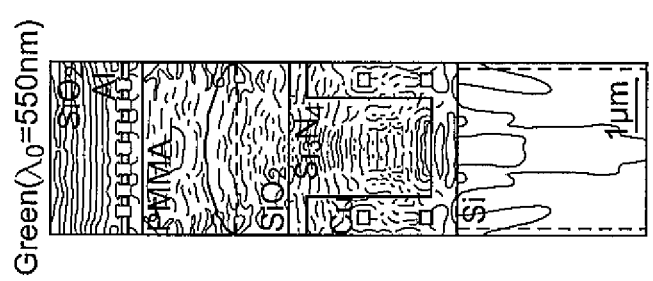
Figure 6A:
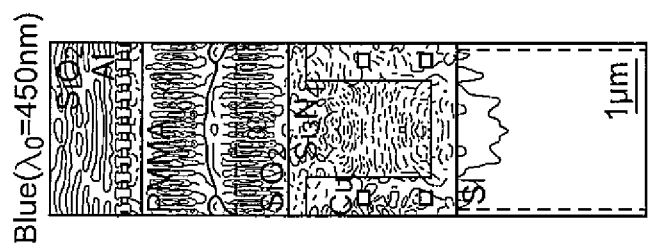

FIGS. 6A-6C show examples of steady state intensity field distributions of three integrated color filters for each of the three colors, read, green and blue. According to an embodiment, a significant factor in the high light coupling efficiency comes from the nitride waveguide which directs the light into the active region of the Si image sensor pixel. Moreover, blue light absorption occurs in the Si pixel near-surface region, while green light absorption occurs at a depth of approximately 1 µm, and red light absorption occurs at a depth of approximately 3 µm below the Si surface.

Figure 7:
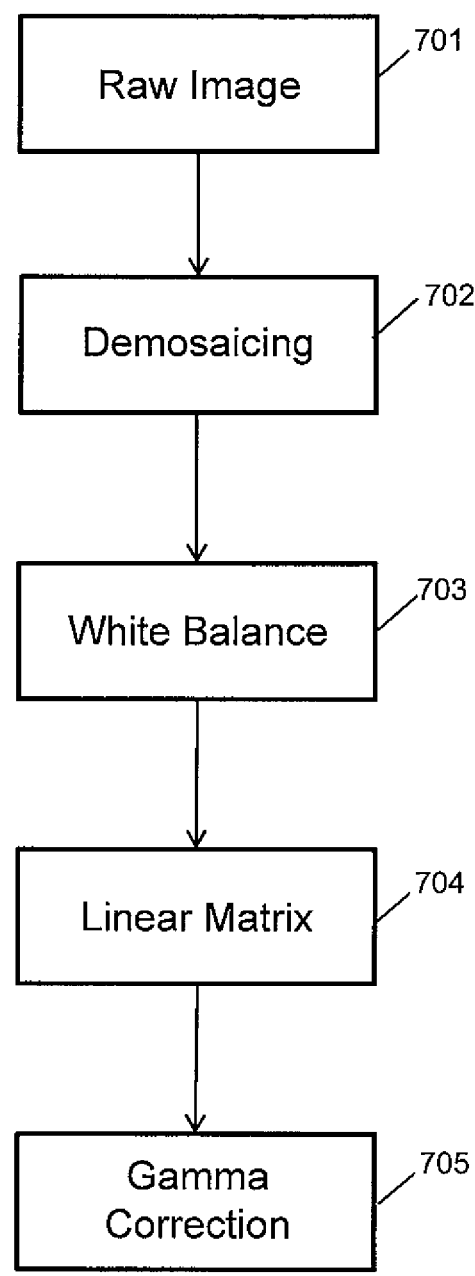
FIG. 7 is a flow chart for processing raw image data taken with a CMOS image sensor integrated with a plasmonic color filter according to an embodiment of the present invention.

FIG. 7 is a flow chart illustrating the processing of 10-bit raw image data (701) taken by a CMOS image sensor integrated with a plasmonic color filter. Since the pixels on the CMOS image sensor are filtered by a Bayer color filter array, each sub-pixel of the pixel has intensity information of only one of three colors, red, green, or blue. To reconstruct the full-color image, a bilinear demosaicing algorithm (702) is used to interpolate the set RGB values for each pixel from its neighbors. For example, the red value of a non-red pixel may be computed as the average of the two or four adjacent red pixels, and similarly for blue and green.

After demosaicing, the image is white balanced (703) by equalizing the RGB signal levels of the gray patches. A linear matrix correction (704) is applied to correct for spectral color crosstalk from the color filter. A purer green spectra with a narrower FWHM and smaller linear matrix cross-terms can be obtained by slightly reducing, for example, the hole diameters and/or changing the period to compensate for the effective surface plasmon path length between holes.

After applying the linear matrix pixel transformation, a gamma correction (705) is applied to convert the linear response brightness of the CMOS image sensor to a logarithmic response of a human eye. As such, the demosaicing (702), white balance adjustment (703), linear matrix (704), and gamma correction (705) can be applied by varying the amplification values corresponding to each pixel and/or sub-pixel of the CMOS image sensor.

For proper filter performance, the filters should function as intended among all aperture angles. The definition of f-number is a ratio of focal length (f) to aperture diameter (D). The half-aperture angle for a given f-number is equal to $\theta_{1/2}=\arctan(\frac{1}{2} F)$. As such, for an f-number of 16, the maximum half-aperture collection angle is 1.8 degrees, which means that the image sensor collects a nearly collimated incident light. On the other hand, for and f-number of 1.8, the half aperture collection angle is 15.5 degrees. The plasmonic hole array filters according to the embodiment of the invention retain their designed filter functionality for larger aperture angles as well as for smaller aperture angles.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims and their equivalents.

The invention claimed is:

1. A color imaging device comprising:
an optical sensor having a plurality of pixels, each pixel of the plurality of pixels comprising a plurality of sub-pixels, wherein each sub-pixel of the plurality of sub-pixels are adapted to sense light; and
a metal film on the optical sensor, the metal film having a group of nano-holes arranged over at least one sub-pixel according to a first periodic lattice formation configured to pass light having a preselected first range of wavelengths, the first periodic lattice configuration having the nano-holes spaced at a first period, each nano-hole of the group of nano-holes having a first diameter,
wherein another group of nano-holes arranged over an adjoining sub-pixel according to a second periodic lattice formation configured to pass light having a second range of wavelengths different from the first range of wavelengths, the second periodic lattice configuration having the another group of nano-holes spaced at a second period, each nano-hole of the another group of nano-holes having a second diameter.

2. The color imaging device of claim 1, wherein the group of nano-holes form a substantially square array and the periodic lattice formation is a triangular lattice.

3. The color imaging device of claim 1, wherein the diameter of each nano-hole of one of the groups of nano-holes is selected to pass light having a preselected range of wavelengths.

4. The color imaging device of claim 3, wherein the diameter of each nano-hole is about 180 nm when the preselected range of wavelengths corresponds to green light, about 240 nm when the preselected range of wavelengths corresponds to red light, and about 140 nm when the preselected range of wavelengths corresponds to blue light.

5. The color imaging device of claim 1, wherein a spacing between adjoining nano-holes of the group of nano-holes is selected to pass light having a preselected range of wavelengths.

6. The color imaging device of claim 5, wherein the period is the same throughout the group of nano-holes.

7. The color imaging device of claim 5, wherein the period of each nano-hole is about 340 nm when the preselected range of wavelengths corresponds to green light, about 420 nm when the preselected range of wavelengths corresponds to red light, and 260 nm when the preselected range of wavelengths corresponds to blue light.

8. The color imaging device of claim 1, wherein the preselected first range of wavelengths corresponds to a first color,
wherein the second range of wavelengths corresponds to a second color, and wherein the first color and the second color correspond to different ones of red, green, and blue light.

9. The color imaging device of claim 8, wherein the groups of nanoholes configured to pass red, green, or blue light are arranged in a Bayer mosaic filter arrangement.

10. The color imaging device of claim 1, wherein the optical sensor is a CMOS image sensor or a CCD image sensor.

11. The color imaging device of claim 1, wherein the metal film is selected from the group consisting of: aluminum, gold, silver, copper, platinum, titanium nitride, indium tin oxide, and doped zinc oxides.

12. The color imaging device of claim 1, wherein a group of nano-holes comprises a preselected number of nano-holes, each having at least a next nearest neighbor relationship to one another.

13. The color imaging device of claim 1, wherein the group of nano-holes comprises four nano-holes.

14. The color imaging device of claim 1, wherein at least one of the groups of nano-holes has less than or equal to four nano-holes.

* * * * *